United States Patent
Kita (10) Patent No.: US 9,407,267 B2
(45) Date of Patent: Aug. 2, 2016

(54) LEVEL CONVERSION CIRCUIT AND LIQUID CRYSTAL DISPLAY DEVICE USING THE SAME

(71) Applicant: Panasonic Liquid Crystal Display Co., Ltd., Himeji-shi, Hyogo (JP)

(72) Inventor: Kazuo Kita, Osaka (JP)

(73) Assignee: Panasonic Liquid Crystal Display Co., Ltd., Osaka (JP)

( * ) Notice: Subject to any disclaimer, the term of this patent is extended or adjusted under 35 U.S.C. 154(b) by 50 days.

(21) Appl. No.: 14/470,357

(22) Filed: Aug. 27, 2014

(65) Prior Publication Data
US 2014/0361966 A1   Dec. 11, 2014

Related U.S. Application Data

(63) Continuation of application No. PCT/JP2013/002094, filed on Mar. 27, 2013.

(30) Foreign Application Priority Data

Apr. 25, 2012   (JP) .................................. 2012-100176

(51) Int. Cl.
*G09G 3/36* (2006.01)
*H03K 19/0185* (2006.01)

(52) U.S. Cl.
CPC .......... *H03K 19/0185* (2013.01); *G09G 3/3648* (2013.01); *G09G 3/3674* (2013.01); *G09G 2310/0278* (2013.01); *G09G 2310/0289* (2013.01)

(58) Field of Classification Search
USPC ............................................ 345/87; 327/333
See application file for complete search history.

(56) References Cited

U.S. PATENT DOCUMENTS

| | | | | |
|---|---|---|---|---|
| 5,646,642 A * | 7/1997 | Maekawa | ....... | H03K 19/018521 326/62 |
| 6,081,131 A * | 6/2000 | Ishii | ............... | H03K 19/018571 326/68 |
| 6,236,256 B1 * | 5/2001 | Brownlow | ........... | G09G 3/3688 327/333 |
| 2004/0257111 A1 | 12/2004 | Tobita | | |
| 2010/0253393 A1 | 10/2010 | Yamamoto et al. | | |
| 2011/0050317 A1 * | 3/2011 | Nonaka | ............ | H03K 17/04206 327/333 |

FOREIGN PATENT DOCUMENTS

| | | |
|---|---|---|
| JP | 2005-012356 | 1/2005 |
| WO | 2009/081619 | 7/2009 |

* cited by examiner

*Primary Examiner* — Alexander Eisen
*Assistant Examiner* — Kebede Teshome
(74) *Attorney, Agent, or Firm* — Hamre, Schumann, Mueller & Larson, P.C.

(57) ABSTRACT

A level conversion circuit includes level conversion portions which are connected in series. The level conversion portion includes circuit blocks. The circuit block inverts an input signal. The circuit block includes a transistor connected between a power supply and a node, a transistor connected between the node and a power supply, a transistor connected between a gate of the transistor and the power supply, and a capacitor connected between an output node and the gate of the transistor. The circuit block carried out level conversion in step with operation of the transistor in accordance with a signal applied from an input node to a gate thereof and operation of the transistor an ON/OFF state of which is switched by application of an output of the circuit block to a gate thereof, to thereby output potential change at the node.

3 Claims, 3 Drawing Sheets

LEVEL CONVERSION CIRCUIT AND LIQUID CRYSTAL DISPLAY DEVICE USING THE SAME

CROSS-REFERENCE TO RELATED APPLICATION

This application is Bypass Continuation of international patent application PCT/JP2013002094, filed: Mar. 27, 2013 designating the United States of America, the entire disclosure of which is incorporated herein by reference. Priority is claimed based on Japanese patent application JP2012-100176, filed: Apr. 25, 2012. The entire disclosure of Japanese patent application JP2012-100176 is incorporated herein by reference in its entirety.

TECHNICAL FIELD

This application relates to a level conversion circuit (level shifter) for amplifying an amplitude of a rectangular wave and a liquid crystal display device using the same. In particular, this application relates to a level conversion circuit which can be formed of transistors of the same conductivity type and a liquid crystal display device including a liquid crystal panel having the level conversion circuit mounted thereon.

BACKGROUND

Data processing and generation of a timing pulse when a liquid crystal display device is driven are carried out using a logic circuit such as an integrated circuit (IC). Many of such circuits operate with a relatively small voltage amplitude of, for example, 0 V to 3.3 V. However, a voltage and a large amplitude beyond a range used in an ordinary logic circuit may be required such as when a signal is supplied to a gate line or a source line in driving a liquid crystal panel. In such a case, a level conversion circuit can convert a HIGH level (H level) potential and a LOW level (L level) potential of a rectangular wave generated by the ordinary logic circuit or the like, and generate a rectangular wave having an amplified amplitude.

When a level conversion circuit is formed of a CMOS circuit, it is necessary to use both a p-channel MOS transistor and an n-channel MOS transistor, which increases the number of manufacturing steps.

Therefore, in order to reduce the number of the manufacturing steps to improve the yield and to reduce the costs, a level conversion circuit is sometimes formed of MOS transistors of a single conductivity type.

Figure 3:
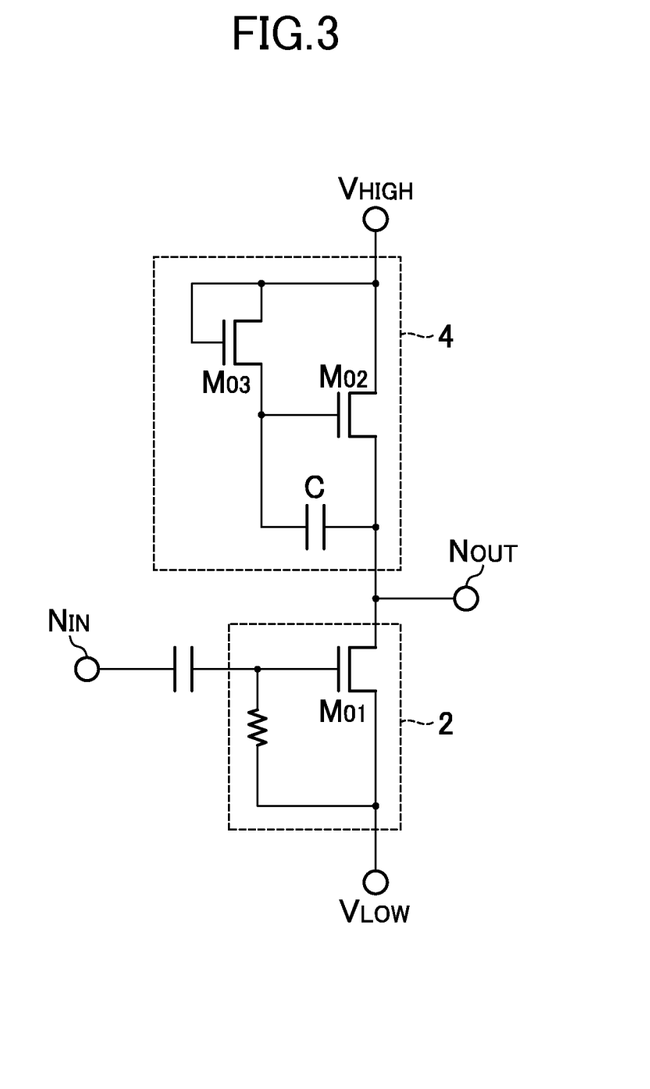
FIG. 3 is a circuit diagram of a related-art level conversion circuit.

FIG. 3 is a circuit diagram of a level conversion circuit disclosed in Japanese Patent Application Laid-open No. 2005-012356 described below. The level conversion circuit has a basic structure as an inverter circuit in which a driver circuit 2 and a load circuit 4 are connected in series between a high potential power supply $V_{HIGH}$ and a low potential power supply $V_{LOW}$, and is configured to generate, in response to an input signal to the driver circuit, an output signal obtained by inverting the voltage change at a node between the driver circuit 2 and the load circuit 4. A source of an nMOS transistor $M_{01}$ forming the driver circuit 2 is connected to the power supply $V_{LOW}$, while a drain of the nMOS transistor $M_{01}$ is connected to an output node $N_{OUT}$. The load circuit 4 is a bootstrap circuit including an nMOS transistor $M_{02}$ connected between the output node $N_{OUT}$ and the power supply $V_{HIGH}$, an nMOS transistor $M_{03}$ diode-connected between a gate of the nMOS transistor $M_{02}$ and the power supply $V_{HIGH}$, and a capacitor C connected between the gate of the nMOS transistor $M_{02}$ and the output node $N_{OUT}$.

For example, when a rectangular wave is input to an inverter having, as a driver transistor, an n-channel transistor disposed on the power supply $V_{LOW}$ side thereof, an ON resistance of the driver transistor is more reduced when the input signal which is the rectangular wave is at the H level than when the input signal is at the L level, to thereby drop a voltage at the output node. In this case, when the load circuit is the bootstrap circuit illustrated in FIG. 3, if the input signal is at the L level, the transistor $M_{03}$ is in an OFF state in step with voltage rise at the output node $N_{OUT}$. As a result, a gate potential of the transistor $M_{02}$ rises to a potential higher than $V_{HIGH}$-$V_{th}$ (where $V_{th}$ is a threshold voltage of the transistor $M_{03}$) to promote voltage rise at the output node $N_{OUT}$.

On the other hand, if the input signal is at the H level, the voltage at the output node $N_{OUT}$ drops. In this case, the transistor $M_{03}$ is in an ON state, and the gate potential of the transistor $M_{02}$ is basically $V_{HIGH}$-$V_{th}$. In other words, while the ON resistance of the transistor $M_{01}$ is reduced in accordance with the H level of the input signal, a gate-source voltage $V_{GS}$ of the transistor $M_{02}$ rises in accordance with the voltage drop at the output node $N_{OUT}$ and an ON resistance of the transistor $M_{02}$ is also reduced. Therefore, there is a problem in that, compared with a case in which the load circuit has a fixed resistance value, voltage drop at the output node $N_{OUT}$ is less steep and the output voltage is less liable to drop. There is another problem in that, because of the above-mentioned problem, it is difficult to increase the amplification factor of the output signal with respect to the input signal.

This application has been made to solve the problems described above, and an object of this application is to provide a level conversion circuit which can obtain a suitable amplification factor by using transistors of a single conductivity type, and to provide a liquid crystal display device using the same.

SUMMARY

According to one embodiment of this application, there is provided a level conversion circuit, which is formed of transistors of the same channel conductivity type and is configured to carry out level conversion of an input signal as a rectangular wave between voltages supplied from a first power supply and a second power supply to generate an output signal having an amplified amplitude, the level conversion circuit including: a first level conversion portion configured to input the input signal from a first input node, generate an intermediate signal obtained by inverting the input signal, and to output the intermediate signal from a first output node; and a second level conversion portion configured to input the intermediate signal from a second input node connected to the first output node, generate the output signal obtained by inverting the intermediate signal, and to output the output signal from a second output node. Each of the first level conversion portion and the second level conversion portion includes: an inverter circuit configured to input a rectangular wave from the input node and output a control signal; and an amplitude amplifying circuit configured to operate in accordance with the control signal input from the inverter circuit, amplify an amplitude of the rectangular wave input from the input node, and to output the amplified rectangular wave from the output node. The inverter circuit includes a first transistor and a load resistor connected in series between the first power supply and the second power supply, the inverter circuit is applied with the rectangular wave from the input node to a gate of the first transistor, and the inverter circuit outputs the control signal obtained by inverting voltage change in the rectangular wave from a node between the first transistor and the load resistor. The amplitude amplifying circuit includes: a second transistor having a channel connected between the first power supply and the output node; a third transistor having a channel connected between the output node and the second power supply; a fourth transistor having a channel connected between a gate of the third transistor and the second power supply; and a bootstrap capacitor connected between the output node and the gate of the third transistor. The amplitude amplifying circuit carries out the level conversion in step with operation of the second transistor in accordance with a signal applied from the input node to a gate of the second transistor and operation of the fourth transistor an ON/OFF state of which is switched by application of the control signal to a gate of the fourth transistor, to thereby generate, at the output node, voltage change having an amplified amplitude with respect to an amplitude at the input node.

In the level conversion circuit according to another embodiment of this application, the load resistor of each of the first level conversion portion and the second level conversion portion is a bootstrap circuit including a fifth transistor, a sixth transistor, and a capacitor. A channel of the fifth transistor and a channel of the first transistor are connected in series and a series connection of the fifth transistor and the first transistor is connected between the first power supply and the second power supply, a channel of the sixth transistor is connected between a gate of the fifth transistor and the second power supply, and the capacitor is connected between a node between the first transistor and the fifth transistor and the gate of the fifth transistor. The bootstrap circuit generates voltage change of the control signal, which has an amplified amplitude with respect to an amplitude at the input node.

According to one embodiment of this application, there is provided a liquid crystal display device, which uses the level conversion circuit, the liquid crystal display device including a pair of insulating substrates disposed so as to be opposed to each other with liquid crystal sandwiched therebetween, one of the pair of insulating substrates being a TFT substrate including a pixel region portion facing another of the pair of insulating substrates disposed in a region where pixels are arranged in matrix and a peripheral portion extending beyond the another of the pair of insulating substrates, the TFT substrate having a pixel arrangement structure formed on a surface of the pixel region portion thereof, the pixel arrangement structure including scanning wirings along respective rows of the pixels, video wirings along respective columns of the pixels, and thin film transistors provided for the respective pixels, the TFT substrate having a scanning line drive circuit for supplying a signal to the scanning wirings, a video line drive circuit for supplying a signal to the video wirings, and the level conversion circuit for supplying a rectangular wave to one of the scanning line drive circuit and the video line drive circuit formed on a surface of the peripheral portion thereof, the level conversion circuit being formed together with the pixel arrangement structure in the pixel region portion in a step of forming the pixel arrangement structure.

In the liquid crystal display device according to another embodiment of this application, the transistors are n-channel conductivity type transistors.

Further, in the liquid crystal display device according to another embodiment of this application, the transistors in the level conversion circuit and the thin film transistors provided for the respective pixels are n-channel conductivity type transistors.

According to one embodiment of this application, an amplification factor of a rectangular wave can be improved in the level conversion circuit using the transistors of a single conductivity type and the liquid crystal display device using the same.

DETAILED DESCRIPTION

An embodiment of this application is described in the following with reference to the attached drawings.

Figure 1:
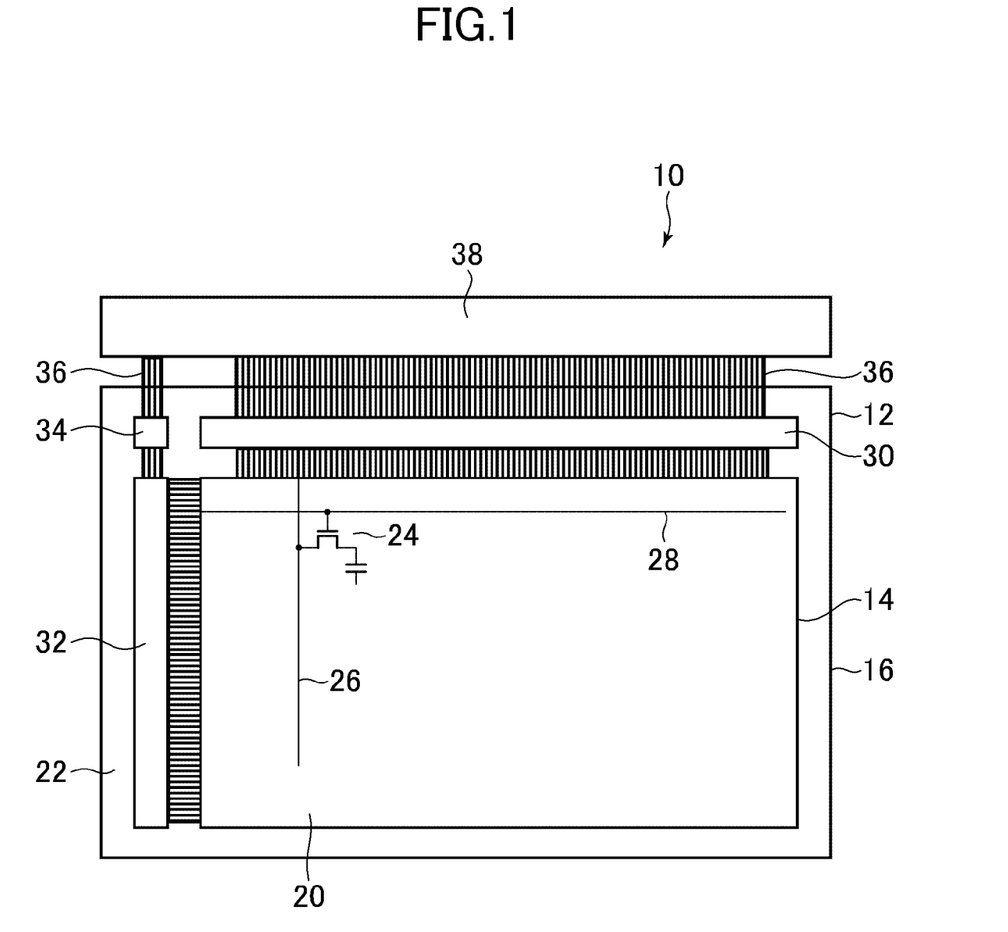
FIG. 1 is a schematic view illustrating a schematic structure of a liquid crystal display device according to an embodiment of this application.

FIG. 1 is a schematic view illustrating a schematic structure of a liquid crystal display device 10 according to this embodiment. The liquid crystal display device 10 includes a liquid crystal panel 12, a backlight unit (not shown), and the like. The liquid crystal panel 12 is, for example, an in plane switching (IPS) active matrix liquid crystal panel. In the liquid crystal panel 12, liquid crystal is filled between a color filter substrate 14 and a TFT substrate 16. Each of the color filter substrate 14 and the TFT substrate 16 is formed by using a transparent glass substrate which is an insulating substrate. A polarizing film is attached on each of an outside surface of the color filter substrate 14 and an outside surface of the TFT substrate 16. The backlight unit is disposed behind the TFT substrate 16.

Pixels are arranged in matrix in an image display region of the liquid crystal display device 10. The color filter substrate 14 has a rectangle shape with a size corresponding to the image display region. Each of the pixels includes a set of, for example, red, green, and blue subpixels. Color filters corresponding to the respective colors of the subpixels are formed on a surface of the color filter substrate 14 on the liquid crystal side, and a black matrix which is a light-shielding film is formed in a pixel separation region.

The TFT substrate 16 has a rectangle shape which is larger than the color filter substrate 14, and includes a portion corresponding to the image display region (pixel region portion 20) and a peripheral portion 22 extending beyond the pixel region portion. The color filter substrate 14 is disposed so as to be opposed to the pixel region portion 20. The peripheral portion 22 is provided between at least one side of the TFT substrate 16 and a side of the color filter substrate 14 in parallel to the side of the TFT substrate 16.

A pixel arrangement structure including thin film transistors (TFTs) 24, source lines 26 (video wirings), gate lines 28 (scanning wirings), pixel electrodes, and a common electrode is formed on a surface of the pixel region portion 20 of the TFT substrate 16 on the liquid crystal side. Specifically, the pixel electrodes and the TFTs are arranged in a matrix manner so as to correspond to the arranged pixels. Each of the pixels includes the common electrode formed of a transparent electrode material similarly to the pixel electrode. The source line 26 is provided for each column of the TFTs 24 (arranged in a vertical direction), and is connected in common to source electrodes of the plurality of TFTs 24 in the column. The gate line 28 is provided for each row of the TFTs 24 (arranged in a horizontal direction), and is connected in common to gate electrodes of the plurality of TFTs 24 in the row. The source lines 26 are arranged along pixel separation regions provided among pixel columns, and the gate lines 28 are arranged along pixel separation regions provided among pixel rows. The plurality of source lines 26 and the plurality of gate lines 28 are arranged so as to be approximately orthogonal to each other. A pixel electrode corresponding to each of the TFTs 24 is connected to a drain electrode of the TFT.

A conduction state of each of the TFTs 24 is controlled by row in accordance with scanning pulses applied to the gate lines 28. The pixel electrode is connected to the source line 26 via the TFT 24 in the ON state, and is applied with a signal voltage (pixel voltage) in accordance with a pixel value from the source line 26. A predetermined common potential common to the pixels is applied to the common electrode via a common electrode wiring. Orientation of the liquid crystal with respect to each pixel is controlled by an electric field generated in accordance with a potential difference between the pixel electrode and the common electrode to change the transmittivity with respect to light incident from the backlight unit, thereby forming an image in the image display region.

A source line drive circuit 30 (video line drive circuit), a gate line drive circuit 32 (scanning line drive circuit), a level conversion circuit 34, and the like are formed on a surface of the peripheral portion 22 of the TFT substrate 16 on which the pixel region portion 20 having the pixel arrangement structure is formed as well. The level conversion circuit 34 is formed together with the pixel arrangement structure in a step of forming the pixel arrangement structure. The source line drive circuit 30 and the gate line drive circuit 32 can also be formed together with the pixel arrangement structure.

The source line drive circuit 30, the gate line drive circuit 32, and the level conversion circuit 34 are connected to a substrate 38 outside the liquid crystal panel 12 via a flexible print circuit (FPC) 36, and are supplied with a timing signal or the like from a control unit provided on the substrate 38 to operate.

A video signal received by a tuner or an antenna (both not shown) or a video signal generated by another device such as a video reproducing device is input to the control unit. Based on the input video signal, the control unit generates and outputs to the source line drive circuit 30 pixel data indicating grayscale values of the respective pixels, and generates timing pulses and clock signals to the source line drive circuit 30, the gate line drive circuit 32, and the level conversion circuit 34.

The gate line drive circuit 32 is arranged in the peripheral portion 22 provided on the right or left side of the pixel region portion 20 along the pixel region portion 20, and is connected to the gate lines 28. The gate line drive circuit 32 includes a shift register. The shift register starts to operate in response to a trigger signal from the control unit, selects the gate lines 28 in sequence in the order along a vertical scanning direction, and outputs the scanning pulse to a selected gate line 28. This turns on the TFTs 24 in a selected pixel row. Note that, the gate line drive circuit 32 may be provided on both sides of the pixel region portion 20 so that a scanning pulse maybe supplied from both sides of the gate lines 28.

The source line drive circuit 30 is arranged in the peripheral portion 22 provided on the upper or lower side of the pixel region portion 20 along the pixel region portion 20, and is connected to the source lines 26 In synchronization with the selection of the gate line 28 by the gate line drive circuit 32, the pixel data of the selected row is input from the control unit to the source line drive circuit 30, and the source line drive circuit 30 generates data voltages in accordance with the respective pixel data of the row. The generated data voltages are output to the source lines 26. In this way, pixel voltages are set with regard to pixel electrodes corresponding to the selected gate line 28. By the way, this corresponds to horizontal scanning of a raster image. A row is selected with regard to each cycle of the horizontal scanning (1 H) within an effective scanning period in a vertical scanning period (1 V), and the pixel voltages are written in the row. The potential of the pixel electrodes when the TFTs 24 are in an OFF state by the operation of writing in the respective rows is basically held until writing in the rows starts in a subsequent frame. Until then, the pixels in the rows are controlled to have a transmittivity in accordance with the potential.

The level conversion circuit 34 is disposed in free space of the peripheral portion 22. Specifically, the source line drive circuit 30 and the gate line drive circuit 32 are disposed in a portion of the peripheral portion 22 along sides of the rectangular pixel region portion 20, but the source line drive circuit 30 and the gate line drive circuit 32 are not disposed in a portion of the peripheral portion 22 around a corner of the TFT substrate 16, and that portion can be free space. Such free space can be effectively used to form the level conversion circuit 34. For example, in FIG. 1, the level conversion circuit 34 is disposed in an upper left corner of the peripheral portion 22 of the TFT substrate 16.

A clock signal is input from the control unit to the level conversion circuit 34, and the H level and L level potentials of the clock signal are converted to generate a clock signal having an amplified amplitude. In this embodiment, the level conversion circuit 34 carries out level conversion and amplification with regard to two-phase clock signals each having a period of 2 H and having a phase shift of 1 H therebetween. The two-phase clock signals generated by the level conversion circuit 34 are supplied to the gate line drive circuit 32. Based on the clock signals, the gate line drive circuit 32 carries out shift operation of the shift register and generates a scanning pulse with regard to each stage of the shift register. The H/L levels of the scanning pulse are set so that the TFTs 24 are suitably turned on/off, and the level conversion circuit 34 generates a clock signal so that the scanning pulse has desired H/L levels. For example, a clock signal having an H level potential $V_{IH}$=3.3 V and an L level potential $V_{IL}$=0 V to be used in the control unit is input to the level conversion circuit 34, and the level conversion circuit 34 generates a clock signal having an H level potential $V_{OH}$=10 V and an L level potential $V_{OL}$=−6 V. Note that, the output of the level conversion circuit 34 may be used in driving the source line drive circuit 30.

Figure 2:
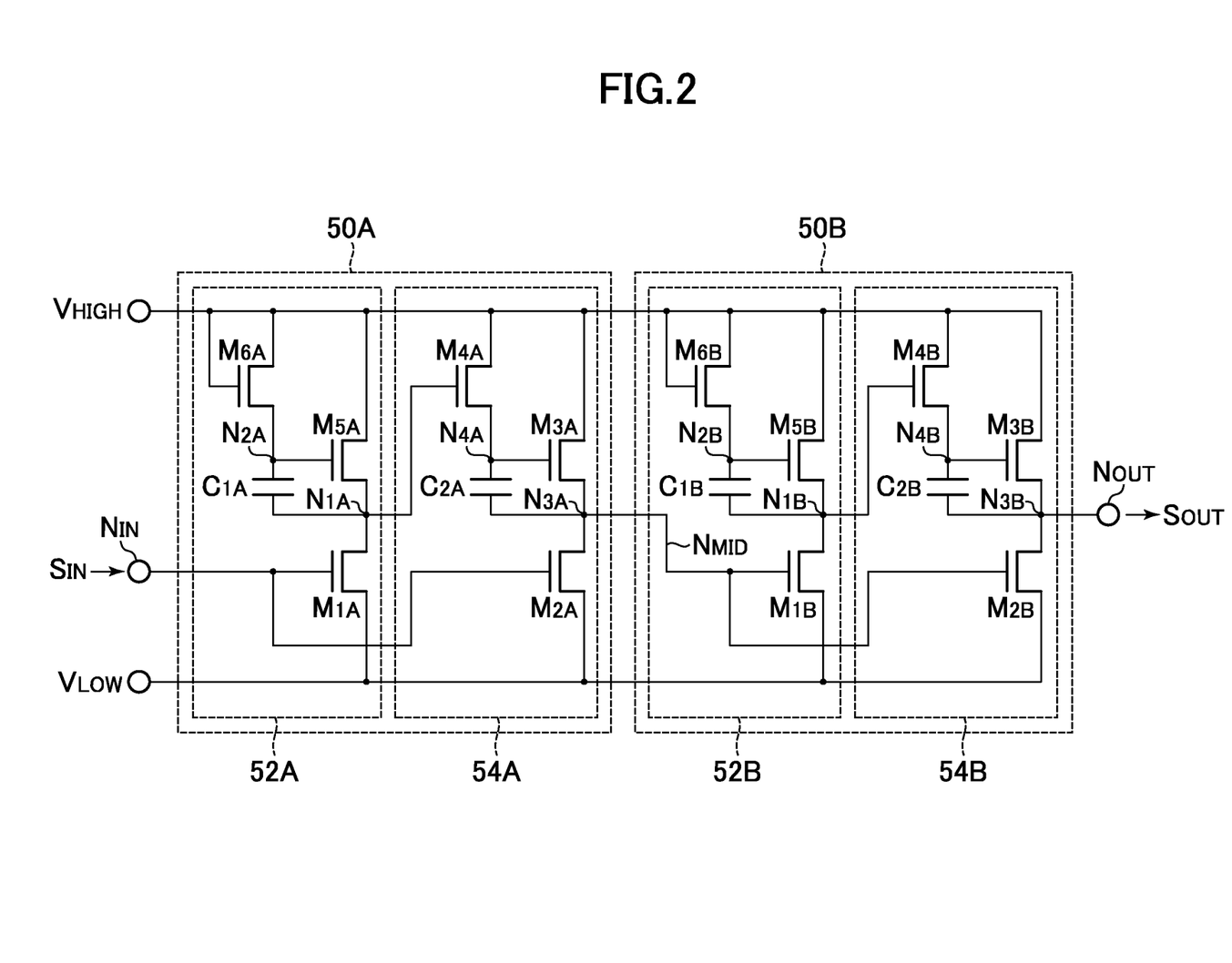
FIG. 2 is a circuit diagram illustrating a basic structure of a level conversion circuit according to the embodiment of this application.

FIG. 2 is a circuit diagram illustrating a basic structure of the level conversion circuit 34. The circuit illustrated in FIG. 2 is provided for each of the above-mentioned two-phase clock signals. The level conversion circuit 34 includes transistors and capacitors, the transistors being n-channel conductivity type transistors. Further, in this embodiment, the level conversion circuit 34 is formed on the surface of the TFT substrate 16, and the transistors are TFTs formed by the same process as that of the TFTs 24 in the pixel region portion 20.

The level conversion circuit 34 is connected to a power supply at a predetermined high potential $V_{HIGH}$ (hereinafter referred to as power supply $V_{HIGH}$) and a power supply at a predetermined low potential $V_{LOW}$ (hereinafter referred to as power supply $V_{LOW}$) Within the range of the voltages supplied by the power supplies, level conversion is carried out with respect to an input clock signal $S_{IN}$ having the H level potential $V_{IH}$ and the L level potential $V_{IL}$, and an output clock signal $S_{OUT}$ having the H level potential $V_{OH}$ and the L level potential $V_{OL}$ and having an amplified amplitude is generated. For example, $V_{HIGH}$ is 17 V and $V_{LOW}$ is −9 V.

The input clock signal $S_{IN}$ is input to the level conversion circuit 34 from an input node $N_{IN}$, and the output clock signal $S_{OUT}$ is output from an output node $N_{OUT}$. The level conversion circuit 34 includes two level conversion portions 50 (50A and 50B) connected in series. An input node of the level conversion portion 50A in the preceding stage is the node $N_{IN}$, and an output node of the level conversion portion 50A is a connection node $N_{MID}$ to the level conversion portion 50B in the subsequent stage. The level conversion portion 50A generates an intermediate clock signal $S_{MID}$ obtained by inverting the input clock signal $S_{IN}$ and outputs the intermediate clock signal to the level conversion portion 50B in the subsequent stage. An input node of the level conversion portion 50B in the subsequent stage is the node $N_{MID}$, and an output node of the level conversion portion 50B is the node $N_{OUT}$. The level conversion portion 50B generates the output clock signal $S_{OUT}$ obtained by inverting the intermediate clock signal $S_{MID}$.

Each of the level conversion portions 50 includes two circuit blocks 52 and 54. Each of the circuit blocks 52 and 54 has a basic structure as a MOS inverter circuit in which a driver transistor and a load resistor circuit which substantially functions as a load resistor are connected in series between the power supply $V_{LOW}$ and the power supply $V_{HIGH}$, and outputs a signal obtained by inverting voltage change in a rectangular wave applied to a gate of the driver transistor from a node between the driver transistor and the load resistor circuit. As described below, the load resistor circuit is a bootstrap circuit. In the following, a structure of the circuit blocks 52 and 54 is further described taking the level conversion portion 50A as an example.

The circuit block 52A includes transistors $M_{1A}$, $M_{5A}$, and $M_{6A}$ and a capacitor $C_{1A}$. The transistor $M_{1A}$ is a driver transistor, and the transistors $M_{5A}$ and $M_{6A}$ and the capacitor $C_{1A}$ form a bootstrap circuit. A source of the transistor $M_{1A}$ is connected to the power supply $V_{LOW}$, a drain of the transistor $M_{1A}$ is connected to a source of the transistor $M_{5A}$, and a gate of the transistor $M_{1A}$ is connected to the input node of the level conversion portion 50A. A drain of the transistor $M_{5A}$ is connected to the power supply $V_{HIGH}$, and a gate of the transistor $M_{5A}$ is connected to a source of the transistor $M_{6A}$. A drain and a gate of the transistor $M_{6A}$ are connected to the power supply $V_{HIGH}$. The capacitor $C_{1A}$ is connected between a node $N_{1A}$ between the transistors $M_{1A}$ and $M_{5A}$ and a node $N_{2A}$ between the gate of the transistor $M_{5A}$ and the source of the transistor $M_{6A}$.

The circuit block 54A includes transistors $M_{2A}$, $M_{3A}$, and $M_{4A}$ and a capacitor $C_{2A}$. The transistor $M_{2A}$ is a driver transistor, and the transistors $M_{3A}$ and $M_{4A}$ and the capacitor $C_{2A}$ form a bootstrap circuit. A source of the transistor $M_{2A}$ is connected to the power supply $V_{LOW}$, a drain of the transistor $M_{2A}$ is connected to a source of the transistor $M_{3A}$, and a gate of the transistor $M_{2A}$ is connected to the input node of the level conversion portion 50A similarly to the transistor $M_{1A}$. A drain of the transistor $M_{3A}$ is connected to the power supply $V_{HIGH}$, and a gate of the transistor $M_{3A}$ is connected to a source of the transistor $M_{4A}$. A drain of the transistor $M_{4A}$ is connected to the power supply $V_{HIGH}$, and a gate of the transistor $M_{4A}$ is connected to the node $N_{1A}$ of the circuit block 52A. The capacitor $C_{2A}$ is connected between a node $N_{3A}$ between the transistors $M_{2A}$ and $M_{3A}$ and a node $N_{4A}$ between the gate of the transistor $M_{3A}$ and the source of the transistor $M_{4A}$. In this case, the node $N_{3A}$ is the connection node $N_{MID}$.

Circuit blocks 52B and 54B include transistors $M_{1B}$ to $M_{6B}$, capacitors $C_{1B}$ and $C_{2B}$, and nodes $N_{1B}$ to $N_{4B}$. A connection relationship in the circuit blocks 52B and 54B is the same as that of the circuit blocks 52A and 54A, and the transistors $M_{1B}$ to $M_{6B}$, the capacitors $C_{1B}$ and $C_{2B}$, and the nodes $N_{1B}$ to $N_{4B}$ respectively correspond to the transistors $M_{1A}$ to $M_{6A}$, the capacitors $C_{1A}$ and $C_{2A}$, and the nodes $N_{1A}$ to $N_{4A}$ in the circuit blocks 52A and 54A described above. In this case, gates of the transistors $M_{1B}$ and $M_{2B}$ are connected to the input node of the level conversion portion 50B, and the node $N_{3B}$ is the output node $N_{OUT}$.

Next, operation of the level conversion circuit 34 is described. In this case, for the sake of simplification of description, all the transistors have the same threshold voltage denoted as $V_{th}$. The level conversion circuit 34 is designed so that, when the input clock signal $S_{IN}$ is at the H level potential $V_{IH}$, the transistors $M_{1A}$ and $M_{2A}$ having the gates to which the input clock signal $S_{IN}$ is applied are turned on. On the other hand, when the input clock signal $S_{IN}$ is at the L level potential $V_{IL}$, the transistors $M_{1A}$ and $M_{2A}$ have an ON resistance which is higher than that when the input clock signal $S_{IN}$ is at $V_{IH}$ (or, are turned off). The transistor $M_{6A}$ is diode-connected between the power supply $V_{HIGH}$ and the gate of the transistor $M_{5A}$, and is turned on when a potential $\phi_{2A}$ at the node $N_{2A}$ is equal to or lower than $(V_{HIGH}-V_{th})$ and is turned off when the potential $\phi_{2A}$ is higher than $(V_{HIGH}-V_{th})$ because the gate-source voltage $V_{GS}$ is lower than $V_{th}$. A potential $\phi_{1A}$ at the node $N_{1A}$ is determined by current drive force (ON resistance) of the transistors $M_{5A}$ and $M_{1A}$ having channels connected in series between the power supply $V_{HIGH}$ and the power supply $V_{LOW}$. Similarly, a potential $\phi_{3A}$ at the node $N_{3A}$ is determined by current drive force (ON resistance) of the transistors $M_{3A}$ and $M_{2A}$.

When the input clock signal $S_{IN}$ drops from $V_{IH}$ to $V_{IL}$, the ON resistance of the transistor $M_{1A}$ becomes higher, and thus, the potential $\phi_{1A}$ rises. In this case, when the input clock signal $S_{IN}$ is at $V_{IH}$, a node of the capacitor $C_{1A}$ on the node $N_{2A}$ side is connected to the power supply $V_{HIGH}$ via the transistor $M_{6A}$ in the ON state, the capacitor $C_{1A}$ is charged at an interterminal voltage $(\phi_{2A}-\phi_{1A})$, and the potential $\phi_{2A}$ is $(V_{HIGH}-V_{th})$. When the input clock signal $S_{IN}$ is at $V_{IL}$ and the potential $\phi_{1A}$ rises, the potential rise is transmitted via the capacitor $C_{1A}$ to the node $N_{2A}$, the potential $\phi_{2A}$ becomes higher than $(V_{HIGH}-V_{th})$, the transistor $M_{6A}$ is in the OFF state, and the node $N_{2A}$ is in a floating state. The ON resistance of the transistor $M_{5A}$ becomes lower in accordance with the rise of the potential $\phi_{2A}$ applied to the gate thereof. Therefore, together with the higher ON resistance of the transistor $M_{1A}$, the potential $\phi_{1A}$ when the input clock signal $S_{IN}$ is at $V_{IL}$ is higher than that when the input clock signal $S_{IN}$ is at $V_{IH}$. The potential $\phi_{1A}$ is expressed as $\phi_{1A}(V_{IL})$.

Because the load circuit of the circuit block 52A is a bootstrap circuit, when the input clock signal $S_{IN}$ changes from $V_{IH}$ to $V_{IL}$, the bootstrap action can quickly cause the transistor $M_{5A}$ to be in a deep ON state. Therefore, compared with a structure using a resistance element or the like, the potential $\phi_{1A}$ can quickly rise to $\phi_{1A}(V_{IL})$.

On the other hand, when the input clock signal $S_{IN}$ rises from $V_{IL}$ to $V_{IH}$, the ON resistance of the transistor $M_{1A}$ is lowered, and thus, the potential $\phi_{1A}$ drops. In this case, in the load circuit which is a bootstrap circuit, the transistor $M_{6A}$ is initially in the OFF state, and thus, capacitive coupling of the capacitor $C_{1A}$ quickly drops the potential $\phi_{2A}$ at the node $N_{2A}$ and the ON resistance of the transistor $M_{5A}$ quickly increases. Therefore, the potential $\phi_{1A}$ can quickly become lower. The potential $\phi_{1A}$ when the input clock signal $S_{IN}$ is at $V_{IH}$ is expressed as $\phi_{1A}(V_{IH})$.

$\phi_{1A}$ ($V_{IH}$) and $\phi_{1A}$ ($V_{IL}$) have a relationship of $\phi_{1A}$ ($V_{IH}$) <$\phi_{1A}$ ($V_{IL}$). Further, $V_{LOW}$<$V_{IL}$<$V_{IH}$<$V_{HIGH}$ holds, and hence $V_{LOW}$<$\phi_{1A}$ ($V_{IH}$)<$V_{IL}$ and $V_{IH}$<$\phi_{1A}$ ($V_{IL}$)<$V_{HIGH}$ can be set.

In the circuit block 54A, change in the potential $\phi_{1A}$ as a control signal is input from the circuit block 52A to the gate of the transistor $M_{4A}$.

When the input clock signal $S_{IN}$ drops from $V_{IH}$ to $V_{IL}$, in the circuit block 54A, the gate potential of the transistor $M_{4A}$ changes from $\phi_{1A}$ ($V_{IH}$) to $\phi_{1A}$ ($V_{IL}$) to cause the transistor $M_{4A}$ to be in the ON state, and a potential $\phi_{4A}$ at a node $N_{4A}$ is ($V_{HIGH}$-$V_{th}$). This charges the capacitor $C_{2A}$ at an interterminal voltage ($\phi_{4A}$-$\phi_{3A}$). Further, when the signal $S_{IN}$ drops from $V_{IH}$ to $V_{IL}$, the ON resistance of the transistor $M_{2A}$ increases in accordance with drop of the gate potential, and thus, the potential $\phi_{3A}$ rises. When the potential $\phi_{3A}$ rises, the potential rise is transmitted via the capacitor $C_{2A}$ to the node $N_{4A}$, the potential $\phi_{4A}$ becomes higher than ($V_{HIGH}$-$V_{th}$), the transistor $M_{4A}$ is in the OFF state, and the node $N_{4A}$ is in a floating state. The ON resistance of the transistor $M_{3A}$ becomes lower in accordance with the rise of the potential $\phi_{4A}$ applied to the gate thereof. Therefore, together with the higher ON resistance of the transistor $M_{2A}$, the potential $\phi_{3A}$ when the input clock signal $S_{IN}$ is at $V_{IL}$ is higher than that when the input clock signal $S_{IN}$ is at $V_{IH}$. The potential $\phi_{3A}$ is expressed as $\phi_{3A}$ ($V_{IL}$).

Because the load circuit of the circuit block 54A is a bootstrap circuit, when the input clock signal $S_{IN}$ changes from $V_{IH}$ to $V_{IL}$, the bootstrap action can quickly cause the transistor $M_{3A}$ to be in a deep ON state. Therefore, compared with a structure using a resistance element or the like, the potential $\phi_{3A}$ can quickly rise to $\phi_{3A}$ ($V_{IL}$).

On the other hand, when the input clock signal $S_{IN}$ rises from $V_{IL}$ to $V_{IH}$, the gate potential of the transistor $M_{4A}$ changes from $\phi_{1A}$ ($V_{IL}$) to $\phi_{1A}$ ($V_{IH}$). Before the change in the input clock signal $S_{IN}$, the transistor $M_{4A}$ is basically in the OFF state by the bootstrap action. After the change in the input clock signal $S_{IN}$, the OFF state is maintained by the gate potential which drops to $\phi_{1A}$ ($V_{IH}$). Further, when the signal $S_{IN}$ rises from $V_{IL}$ to $V_{IH}$, the ON resistance of the transistor $M_{2A}$ reduces, and thus, the potential $\phi_{3A}$ drops. In this case, capacitive coupling of the capacitor $C_{2A}$ quickly drops the potential $\phi_{4A}$ to transient from a state higher than ($V_{HIGH}$-$V_{th}$) to a state of ($V_{HIGH}$-$V_{th}$), and the ON resistance of the transistor $M_{3A}$ quickly increases. Further, in the circuit block 54A, as described above, the transistor $M_{4A}$ maintains the OFF state, and thus, even when the potential $\phi_{4A}$ is equal to or lower than ($V_{HIGH}$-$V_{th}$), the node $N_{4A}$ is held in the floating state. Therefore, the capacitive coupling of the capacitor $C_{2A}$ causes the potential $\phi_{4A}$ to suitably follow the potential $\phi_{3A}$ to further drop. Specifically, compared with a case in which the transistor $M_{4A}$ has a simple diode connection and the potential $\phi_{4A}$ is basically fixed to ($V_{HIGH}$-$V_{th}$), the gate-source voltage $V_{GS}$ of the transistor $M_{3A}$ drops, and the ON resistance of the transistor $M_{3A}$ increases in accordance therewith. Therefore, the potential $\phi_{3A}$ can quickly drop, and at the same time, the drop amount can be increased. The potential $\phi_{3A}$ when the input clock signal $S_{IN}$ is $V_{IH}$ is expressed as $\phi_{3A}$ ($V_{IH}$).

$\phi^{3A}$ ($V_{IH}$) and $\phi_{3A}$ ($V_{IL}$) have a relationship of $\phi_{3A}$ ($V_{IH}$) <$\phi_{3A}$ ($V_{IL}$). Further, $V_{LOW}$<$\phi_{3A}$ ($V_{IH}$)<$V_{IL}$ and $V_{IH}$<$\phi_{3A}$ ($V_{IL}$) <$V_{HIGH}$ can be set, and the amplitude of potential change at the node $N_{3A}$ can be amplified with an amplification factor which is larger than one with respect to the input clock signal $S_{IN}$. In particular, as described above, the amplification factor can be improved by, in addition to increasing the rise amount of the potential $\phi_{3A}$ by the bootstrap action when the input clock signal $S_{IN}$ is at $V_{IL}$, increasing the drop amount of the potential $\phi_{3A}$ when the input clock signal $S_{IN}$ is at $V_{IH}$.

Operation of the circuit blocks 52B and 54B is basically similar to that of the circuit blocks 52A and 54A described above. However, instead of the input clock signal $S_{IN}$ to the node $N_{IN}$ in the circuit block 52A, the clock signal (intermediate clock signal) $S_{MID}$ which has the L level of $\phi_{3A}$ ($V_{IH}$) and the H level of $\phi_{3A}$ ($V_{IL}$) and which has an inverted phase with respect to that of the input clock signal $S_{IN}$ is input from the level conversion portion 50A to the node $N_{MID}$ in the circuit block 52B. The circuit block 52B supplies, as a control signal, a potential $\phi_{1B}$ at the node $N_{1B}$ to the gate of the transistor $M_{4B}$ in the circuit block 54B. $\phi_{1B}$ ($V_{IH}$)>$\phi_{1B}$ ($V_{IL}$) holds, where $\phi_{1B}$ ($V_{IH}$) is $\phi_{1B}$ when the intermediate clock signal $S_{MID}$ is at the L level and $\phi_{1B}$ ($V_{IL}$) is $\phi_{1B}$ when the intermediate clock signal $S_{MID}$ is at the H level. When the intermediate clock signal $S_{MID}$ is at the L level, the transistor $M_{4B}$ can be diode-connected, and the transistor $M_{2B}$ can be in a state of having a high ON resistance. On the other hand, when the intermediate clock signal $S_{MID}$ is at the H level, the transistor $M_{4B}$ is in the OFF state and the transistor $M_{2B}$ is in a state of having a low ON resistance. $\phi_{3B}$ ($V_{IH}$)>$\phi_{3B}$ ($V_{IL}$) holds, where $\phi_{3B}$ ($V_{IH}$) is $\phi_{3B}$ when the intermediate clock signal $S_{MID}$ is at the L level and $\phi_{3B}$ ($V_{IL}$) is $\phi_{3B}$ when the intermediate clock signal $S_{MID}$ is at the H level. The output clock signal $S_{OUT}$ in which $\phi_{3B}$ ($V_{IH}$) is the H level potential $V_{OH}$ and $\phi_{3B}$ ($V_{IL}$) is the L level potential $V_{OL}$ is output from the output node $N_{OUT}$.

Similarly to the level conversion portion 50A, the level conversion portion 50B converts levels of the input clock signal and generates and outputs a clock signal amplified with an amplification factor which is larger than one.

As described above, each of the level conversion portions 50 can improve the amplification factor, and the level conversion circuit 34 can realize a large amplification factor. Note that, the voltages held by the capacitors $C_{2A}$ and $C_{2B}$ in the circuit blocks 54 can drop by leakage currents of the transistors $M_{3A}$ and $M_{3B}$.

Therefore, it is suitable for the purpose of securing the amplification factor that capacitances of these capacitors are basically set to be large to an extent that the voltage drop due to the leakage currents does not affect the bootstrap operation. In an actual case, as the capacitance becomes larger, the size of the level conversion circuit 34 generally becomes larger, and thus, the capacitances may be determined also taking into consideration the upper limit of the size of the circuit in design.

The level conversion portion 50A and the level conversion portion 50B may be the same in the basic structure. However, the level conversion portion 50B is required to have the driving ability in accordance with a load connected to the output node $N_{OUT}$. For example, when a heavy load is driven, elements include in the circuit block 54B are elements capable of handling a larger current and a heavier charge than elements in the circuit block 54A. Specifically, the transistor channel width and the capacitor capacitance in the circuit block 54B are set to be larger than those in the circuit block 54A.

Further, each of the level conversion portions 50 is a feedforward circuit, and can operate at high speed and can reduce phase delay between the input and the output of the level conversion circuit 34. Further, a single-end signal is input to and output from the level conversion circuit 34 and the structure of the circuit is simple. By connecting two stages of the level conversion portions 50 in series each providing an inverted output, under a state in which the input clock signal $S_{IN}$ to the level conversion circuit 34 is fixed to an OFF state, that is, the L level, the potential at the output node $N_{OUT}$ is also set at the L level. For example, in this embodiment, the L level potential $V_{OL}$ of the output signal is −6 V while the H level potential $V_{OH}$ is 10 V. In such a structure that, in a case where the absolute value of $V_{OL}$ is smaller than the absolute value of $V_{OH}$, the output is fixed to $V_{OL}$ when the input clock signal $S_{IN}$ is in the OFF state, absolute values of voltages applied to wiring and a circuit connected to the output of the level conversion circuit 34 become smaller. Therefore, this structure is suitable from the viewpoint of, for example, reducing the power consumption and improving the safety of the circuit.

In the embodiment described above, the transistors included in the level conversion circuit 34 are n-channel transistors, but a level conversion circuit 34 including p-channel transistors can also be realized. Further, a semiconductor layer of each of the TFTs which are the transistors maybe formed of a transparent amorphous oxide semiconductor (TAOS), but the semiconductor layer may also be formed by using other materials such as low-temperature polysilicon and amorphous silicon.

The level conversion circuit 34 described above is formed by effectively using free space in the peripheral portion 22 of the TFT substrate 16, and thus, increase in size of the liquid crystal panel 12 can be inhibited.

Further, the level conversion circuit 34 can be formed basically without using a resistance element, and thus, can be formed on the surface of the TFT substrate 16 in manufacturing steps similar to those for the pixel arrangement structure in the pixel region portion 20, which is convenient. When the level conversion circuit 34 is not formed on the TFT substrate 16, on the other hand, the load circuit in the circuit block 52 maybe, instead of the bootstrap circuit described above, a resistance element connected between the driver transistor $M_{1A}$ or $M_{1B}$ and the power supply $V_{HIGH}$.

While the foregoing has described what are considered to be the best mode and/or other examples, it is understood that various modifications may be made therein and that the subject matter disclosed herein maybe implemented in various forms and examples, and that they may be applied in numerous applications, only some of which have been described herein. It is intended by the following claims to claim any and all modifications and variations that fall within the true scope of the present teachings.

What is claimed is:

1. A liquid crystal display device, comprising:
   a pair of insulating substrates disposed so as to be opposed to each other with liquid crystal sandwiched therebetween,
   one of the pair of insulating substrates being a TFT substrate including a pixel region portion facing another of the pair of insulating substrates disposed in a region where pixels are arranged in matrix and a peripheral portion extending beyond the another of the pair of insulating substrates,
   the TFT substrate having a pixel arrangement structure formed on a surface of the pixel region portion thereof, the pixel arrangement structure including scanning wirings along respective rows of the pixels, video wirings along respective columns of the pixels, and thin film transistors provided for the respective pixels,
   the TFT substrate having a scanning line drive circuit for supplying a signal to the scanning wirings, a video line drive circuit for supplying a signal to the video wirings, and a level conversion circuit for supplying a rectangular wave to one of the scanning line drive circuit and the video line drive circuit formed on a surface of the peripheral portion thereof,
   the level conversion circuit being formed of transistors of a same channel conductivity type and is configured to carry out level conversion of an input signal as a rectangular wave between voltages supplied from a first power supply and a second power supply to generate an output signal having an amplified amplitude, the level conversion circuit comprising:
   a first level conversion portion configured to input the input signal from a first input node, generate an intermediate signal obtained by inverting the input signal, and to output the intermediate signal from a first output node; and
   a second level conversion portion configured to input the intermediate signal from a second input node connected to the first output node, generate the output signal obtained by inverting the intermediate signal, and to output the output signal from a second output node,
   wherein each of the first level conversion portion and the second level conversion portion comprises:
   an inverter circuit configured to input a rectangular wave from the first or the second input node and output a control signal; and
   an amplitude amplifying circuit configured to operate in accordance with the control signal input from the inverter circuit, amplify an amplitude of the rectangular wave input from the first or the second input node, and to output the amplified rectangular wave from the first or the second output node,
   the inverter circuit comprising a first transistor and a load resistor connected in series between the first power supply and the second power supply, the inverter circuit being applied with the rectangular wave from the first or the second input node to a gate of the first transistor, the inverter circuit outputting the control signal obtained by inverting voltage change in the rectangular wave from a node between the first transistor and the load resistor,
   the amplitude amplifying circuit comprising:
   a second transistor having a channel connected between the first power supply and the first or the second output node;
   a third transistor having a channel connected between the first or the second output node and the second power supply;
   a fourth transistor having a channel connected between a gate of the third transistor and the second power supply; and
   a bootstrap capacitor connected between the first or the second output node and the gate of the third transistor, and
   the amplitude amplifying circuit carrying out the level conversion in step with operation of the second transistor in accordance with a signal applied from the first or the second input node to a gate of the second transistor and operation of the fourth transistor an ON/OFF state of which is switched by application of the control signal to a gate of the fourth transistor, to thereby generate, at the first or the second output node, voltage change having an amplified amplitude with respect to an amplitude at the first or the second input node,
   wherein the load resistor of each of the first level conversion portion and the second level conversion portion comprises a bootstrap circuit including a fifth transistor, a sixth transistor, and a capacitor;
   a channel of the fifth transistor and a channel of the first transistor are connected in series, and a series connection of the fifth transistor and the first transistor is connected between the first power supply and the second power supply;
a channel of the sixth transistor is connected between a gate of the fifth transistor and the second power supply;
the capacitor is connected between a node between the first transistor and the fifth transistor and the gate of the fifth transistor;
the bootstrap circuit generates voltage change of the control signal, which has an amplified amplitude with respect to an amplitude at the first or the second input node; and
the level conversion circuit being formed together with the pixel arrangement structure in the pixel region portion in a step of forming the pixel arrangement structure.

2. The liquid crystal display device according to claim 1, wherein the transistors comprise n-channel conductivity type transistors.

3. The liquid crystal display device according to claim 1, wherein the transistors in the level conversion circuit and the thin film transistors provided for the respective pixels comprise n-channel conductivity type transistors.

* * * * *